United States Patent [19]

Funaba

[11] Patent Number: 5,352,628
[45] Date of Patent: Oct. 4, 1994

[54] METHOD OF FORMING DIFFUSION REGION OF SEMICONDUCTOR DEVICE BY SOLID PHASE DIFFUSION

[75] Inventor: Shinji Funaba, Itami, Japan

[73] Assignee: Mitsubishi Denki Kabushiki Kaisha, Tokyo, Japan

[21] Appl. No.: 19,873

[22] Filed: Feb. 19, 1993

[30] Foreign Application Priority Data

Feb. 20, 1992 [JP] Japan .................................. 4-033355

[51] Int. Cl.$^5$ .......................................... H01L 21/225
[52] U.S. Cl. .................................. 437/161; 437/133; 437/167; 437/976
[58] Field of Search ................ 437/110, 133, 160, 161, 437/167, 934, 969, 976, 987; 148/DIG. 35, DIG. 65, DIG. 67, DIG. 97, DIG. 160

[56] References Cited

U.S. PATENT DOCUMENTS

| | | | |
|---|---|---|---|
| 4,957,879 | 9/1990 | Omura et al. | 437/133 |
| 4,980,313 | 12/1990 | Takahashi | 437/161 |
| 5,023,199 | 6/1991 | Murakami et al. | 437/167 |
| 5,089,437 | 2/1992 | Shima et al. | 437/160 |

OTHER PUBLICATIONS

Ogawa et al, "Pin Photodiode Fabricated By Flash Annealing of ZnO/SiO$_2$ Film," Collections of Manuscipts for Lectures at the 46th Conference of the Japan Society of Applied Physics, 1985, p. 167, and translation.

Primary Examiner—Tom Thomas
Assistant Examiner—Chandra Chaudhari
Attorney, Agent, or Firm—Leydig, Voit & Mayer

[57] ABSTRACT

An impurity is diffused into semiconductor epitaxial layers of a semiconductor device from a solid phase diffusion source through an additional thin film layer disposed on the epitaxial layers of the structure. After the diffusion, the thin film layer is removed. The material of the additional thin film layer has physical properties approximating those of the epitaxial layers. Accordingly, no crystallographic defects such as dislocations are introduced into the epitaxial layers by heat treatment, and, accordingly, the resulting device has reduced leakage current.

17 Claims, 5 Drawing Sheets

METHOD OF FORMING DIFFUSION REGION OF SEMICONDUCTOR DEVICE BY SOLID PHASE DIFFUSION

This invention relates to a method of forming a diffusion region in semiconductor devices such as FET's, bipolar transistors, LED's, diodes, and avalanche photodiodes, by means of solid phase diffusion, to provide an efficient method of making semiconductor devices with low leakage current.

BACKGROUND OF THE INVENTION

Techniques for forming diffusion regions of semiconductor devices include ion implantation, gaseous phase diffusion, and solid phase diffusion. With ion implantation, disadvantageously, the depth of resulting diffusion regions is shallow, namely, only on the order of 1 μm, and a high temperature of from 700° to 800° C. is required for annealing. Sufficient depth can be achieved when gaseous phase diffusion is employed, but, disadvantageously, the area of a resulting diffusion region is small and a high temperature of 700°–800° C. for annealing is required. In contrast, solid phase diffusion can provide a large depth and a large area diffusion region, and the annealing temperature is lower, namely, 400°–500° C. Thus, solid phase diffusion is suitable for forming diffusion regions of semiconductor devices.

An example of a conventional technique of forming a diffusion region by means of solid phase diffusion is now described with reference to FIGS. 1(a)–1(h), which illustrate fabrication of an InGaAs/InP photodiode.

As shown in FIG. 1(a), on an n+-type InP substrate 1, an n−-type InGaAs light absorbing layer 2, an n−-type InP window layer 3, and n−-type InGaAs contact layer 4, which are epitaxial layers, are uniformly grown in the named order by, for example, gaseous phase growth. In this case, the lattice constant difference between the n−-type InGaAs light absorbing layer 2 and n+-type InGaAs contact layer 4 is within a range of ±0.3 %.

In the step shown in FIG. 1(b), a SiN masking film 7 is deposited uniformly over the n−-type InGaAs contact layer 4 by means of, for example, plasma CVD. Then, photolithography is employed to form an aperture A, using an etchant, such as hydrofluoric acid, only in that portion of the film 7 through which solid phase diffusion is to be carried out.

Then, as shown in FIG. 1(c), a uniform ZnO diffusion source layer 8 and a uniform SiO$_2$ capping layer 9 each having a thickness of about 1000 Å are successively desposited by sputtering on the masking film 7 and the layer 4 exposed through the aperture A.

In the step shown in FIG. 1(d), the structure shown in FIG. 1(c) is subjected to heat treatment in an N$_2$ gas atmosphere at a temperature of about 500° C. for several tens of minutes to effect diffusion of Zn, which results in a p-type region 10. (In FIG. 1(d), a broken line indicates a diffusion front.)

Next, the SiO$_2$ layer 9, the ZnO diffusion source layer 8, and the SiN layer 7 are removed by selective etching, using an etchant, such as hydrofluoric acid, which results in a structure shown in FIG. 1(e). Then, using nitric acid for selective etching, the n−-type InGaAs contact layer 4 is removed, leaving a p-type inversion layer 4a which is part of that portion of the layer 4 which has been inverted to p-type. This results in a structure shown on 1(f). The top surface of the structure shown in FIG. 1(f) is covered with an SiN film 11, leaving the top surface of the p-type inversion layer 4a uncovered, as shown in FIG. 1(g).

Finally, an Au/Ti electrode 12 is formed for connection to the p-type inversion layer 4a, and an Au/AuGe electrode 13 is formed on the opposite surface of the substrate 1, as shown in FIG. 1(h).

According to the conventional solid phase diffusion, a solid phase diffusion source is vapor deposited directly on an epitaxial layer of a resulting semiconductor device. Accordingly, when the structure is subjected to heat treatment, distortions are produced due to differences in physical constants, such as thermal expansion coefficients, of the two materials, which could result in defects, such as dislocation, in epitaxial layers forming the device. Such defects could cause an increase in leakage current.

SUMMARY OF THE INVENTION

An object of the present invention is to provide a method of forming a diffusion region of a semiconductor device by solid phase diffusion, which does not produce defects in epitaxial layers of the semiconductor device so that the device has reduced leakage current.

According to the present invention, on one of the semiconductor epitaxial layers forming a semiconductor device, at least one additional thin film layer having a thermal expansion coefficient approximating to that of the semiconductor epitaxial layer is grown and a solid phase diffusion source material is placed on the thin film layer(s). Then, the structure is subjected to heat treatment to diffuse the impurity through the thin film layer(s) to a desired depth. After that, the solid phase diffusion source material and part or all of the additional thin film layer(s) are removed.

In order for the additional thin film layer(s) to be removed entirely or partly, the thin film layer(s) are preferably a material which can be selectively etched with respect to the semiconductor epitaxial layer, and the removal of the thin film layer(s) is preferably carried out by etching.

Preferably, the difference in thermal expansion coefficients of the additional thin film layer(s) and the uppermost epitaxial layer is 3×10° C. or less.

When the total thickness of the additional thin film layer(s) is too small, thermal distortion will extend to the semiconductor epitaxial layer. Therefore, the total thickness should be 100 Å or larger. However, if the thickness is too large, a longer time will be required for diffusion and further control of diffusion profile becomes difficult. Accordingly, the thickness is preferably 5 μm or less.

In order to avoid defects in the semiconductor epitaxial layer which would otherwise be produced if a lattice constant difference were present between the additional thin film layer(s) and the semiconductor epitaxial layers, the thin film layer(s) should preferably be semiconductor epitaxial layers so that the difference in lattice constants between the additional thin film layer(s) and the uppermost epitaxial layer to forming the device is small or within a range of ±0.3 %. Formation of defects can be further reduced by disposing in the additional thin film layer(s), a semiconductor superlattice layer or a strained superlattice layer having a thickness of 500 Å or less.

A portion of each of the additional thin film layers or the uppermost additional thin film layers is formed of a material which does not react with the solid phase diffusion source material at a temperature within a range of temperatures to which the solid phase diffusion source material is heated for diffusion, so good diffusion will result. Preferred combinations of the solid phase diffusion source material and the material of the additional thin film layers include, for example, ZnO/InGaAs, ZnO/InGaAsPw ZnO/GaAs, and Si/GaAs. ZnO can be evaporated by sputtering, and Si can be electron-beam vapor deposited.

After the diffusion step, part of the additional thin film layers may be removed so as to give some other functions to the remaining portions of the additional thin film layers. For example, only portions of the additional thin film layers in contact with and near the solid phase diffusion source material may be removed so that the remaining portions may function as a shock buffer layer for protecting the surface of the epitaxial layer forming the semiconductor device from shock which may be given during a wire bonding operation, or function to block background light so as to prevent degradation in the frequency response of the device when it is a photodiode or an avalanche diode.

The thickness of the additional thin film layer contacting the solid phase diffusion source may be gradually varied to control the profile of the diffusion region.

Further, the additional thin film layer may include a second solid phase diffusion source so that different impurities can be simultaneously diffused into the semiconductor epitaxial layer of the device.

According to the present invention, between a semiconductor epitaxial layer of a semiconductor device and a solid phase diffusion layer, an additional thin film layer is disposed. The additional thin film layer will be entirely or partly removed after the diffusion step. The additional thin film layer has a thermal expansion coefficient which is closer to that of the semiconductor epitaxial layer of the device than the thermal expansion coefficient of the solid phase diffusion layer, and, accordingly, defects which could be caused by thermal strain due to a difference between the thermal expansion coefficient of the solid phase diffusion source and the semiconductor epitaxial layer are confined to the additional thin film layer and prevented from being introduced into the semiconductor epitaxial layer of the semiconductor device.

In case the film thickness of the additional thin film layer contacting the solid phase diffusion source is gradually increased to control the shape of the diffusion front, the thickness may gradually decrease inward from the periphery of a diffusion region as defined by a diffusion mask. With this arrangement, the radius of curvature of the diffusion front becomes relatively large, that is, the curving of the diffusion front is gradual, which prevents electric field concentration and, hence, edge breakdown.

A second solid phase diffusion source may be incorporated into the additional thin film layer so that a $p^+$-type region may be formed in an n-type substrate by diffusion from the first diffusion source and the peripheral region of the $p^+$-type region may be changed to an $n^+$-type region which acts as a channel stopper.

DETAILED DESCRIPTION OF THE INVENTION

Now, the present invention is described with reference to FIGS. 2, and 3(a)-3(h), which show one embodiment of the present invention. According to this embodiment, a diffusion region is formed to produce an InGaAs photodiode similar to the conventional one shown in FIG. 1. FIG. 2 is an enlarged cross-sectional view of a structure in a step which shows a feature of the present invention.

Figure 3A:
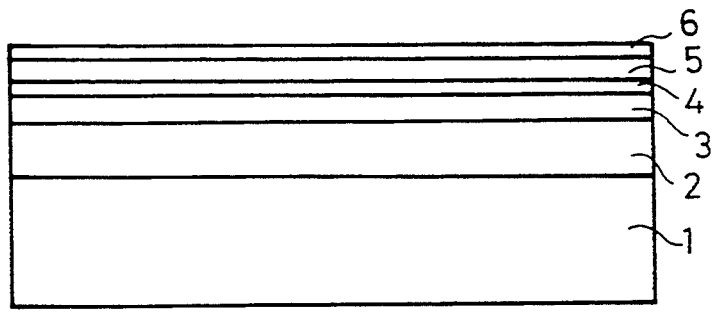
FIGS. 3(a)-3(h) illustrate successive steps of forming a diffusion region of the semiconductor device of FIG. 2 by solid phase diffusion.

In a step shown in FIG. 3(a), additional thin film layers including an $n^-$-type InP capping layer 5 and an $n^-$-type InGaAs capping layer 6 are disposed on an InGaAs contact layer 4 which is the uppermost of the epitaxial layers of an ultimate semiconductor device. The additional thin film layers 5 and 6 are formed in the same epitaxial growth process as the epitaxial layers of the device are formed. The differences in the degree of lattice matching between the $n^-$-type InGaAs contact layer 4 and an $n^-$-type InP window layer 3 and between the $n^-$-type InGaAs capping layer 6 and the $n^-$-type InP capping layer 5, respectively, should be within a range of ±0.3 %. The difference in thermal expansion coefficients between the capping layers 5 and 6 and the contact layer 4 is $3 \times 10^{-6}/°$ C. or less.

Figure 3B:
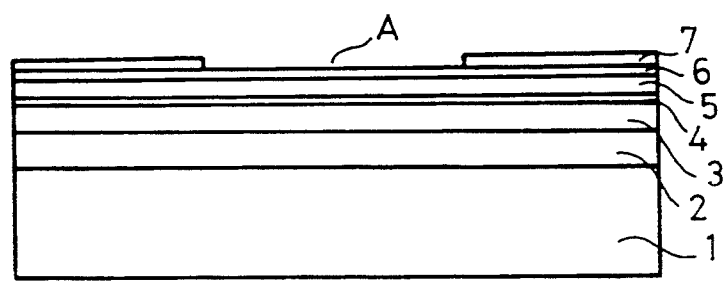

In a step shown in FIG. 3(b), a uniform SiN masking film 7 is deposited on the $n^-$-type InGaAs capping layer 6 by plasma CVD. Photolithography is used to form an aperture A in the film 7 by etching with hydrofluoric acid that portion of the film 7 through which solid phase diffusion is to be carried out.

Figure 3C:
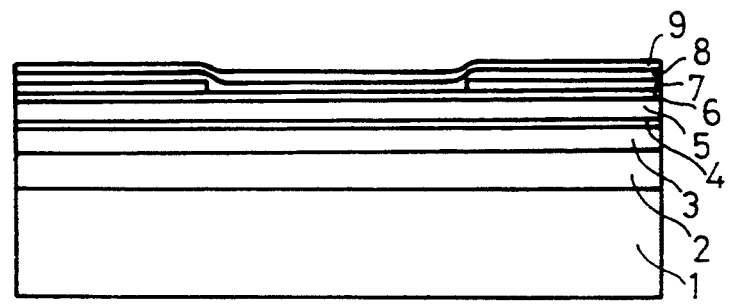

Then, as shown in FIG. 3(c), a ZnO diffusion source layer 8 and an $SiO_2$ capping layer 9 each of which has a thickness on the order of 1000 Å are successively sputtered on the top surface of the structure shown in FIG. 3(b).

Figure 2:
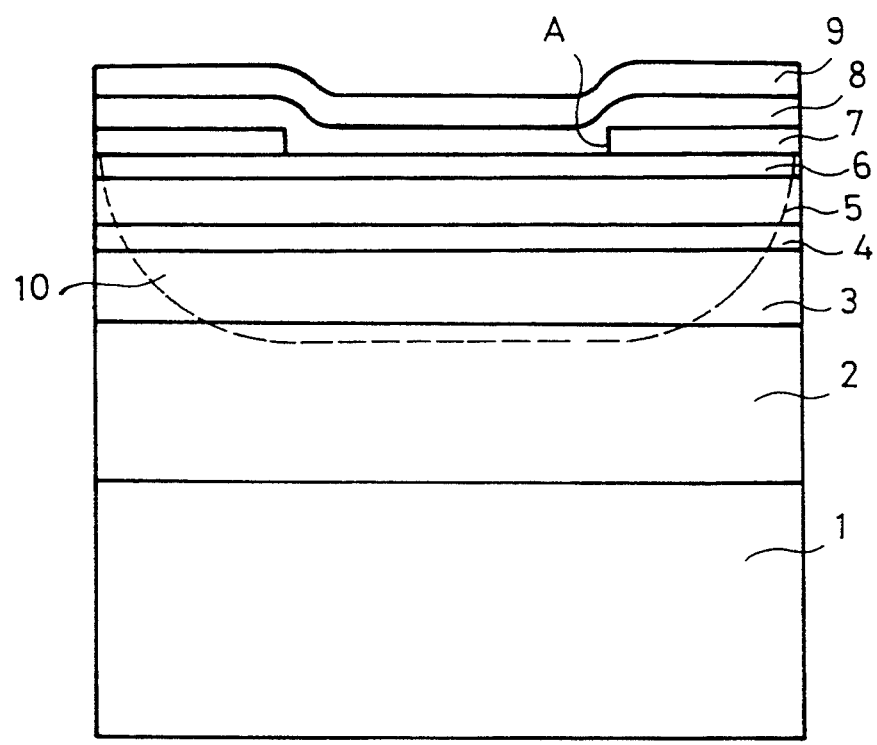
FIG. 2 is an enlarged cross-sectional view of a semiconductor device including an epitaxial layer in a manufacturing step characteristic of one embodiment of the present invention.
Figure 3D:
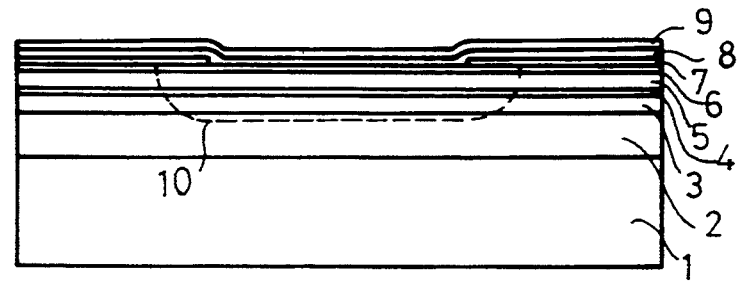
Figure 3E:
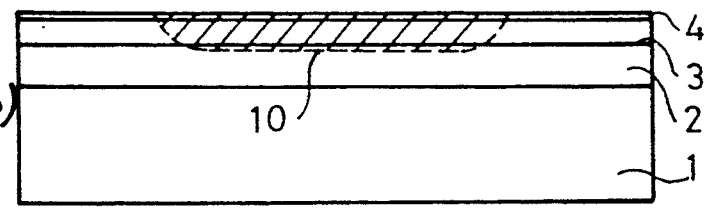

In a step shown in FIG. 3(d), the structure is subjected to heat treatment at a temperature of about 500° C. for several tens of minutes in an $N_2$ gas atmosphere. This causes Zn to be diffused so that a p-type region 10 is formed. The step shown in FIG. 3(d) is characteristic of the present invention wherein the $n^-$-type InGaAs capping layer 6 and the $n^-$-type InP capping layer 5, i.e. the additional thin film layers, are used in carrying out solid phase diffusion. FIG. 2 is an enlarged cross-sectional view illustrating this step.

The $SiO_2$ capping layer 9 and the SiN masking film 7 are selectively etched with hydrofluoric acid, and, then, nitric acid is used for selectively etching the $n^-$-type InGaAs capping layer 6. Then, hydrochloric acid is used to selectively etch the $n^-$-type InP capping layer 5. This results in the structure shown in FIG. 3(e).

Figure 1A:
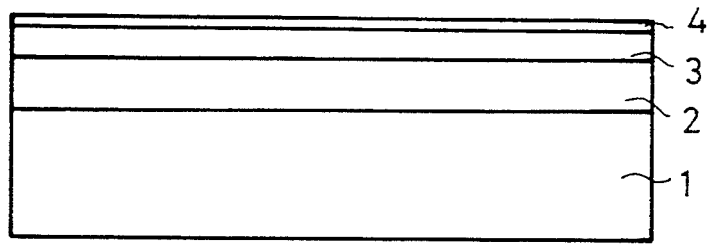
FIGS. 1(a)-1(h) illustrate successive steps of making a diffusion region of a semiconductor device by prior art solid phase diffusion.
Figure 1B:
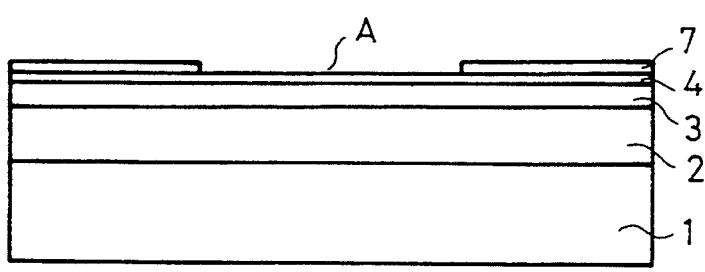
Figure 1C:
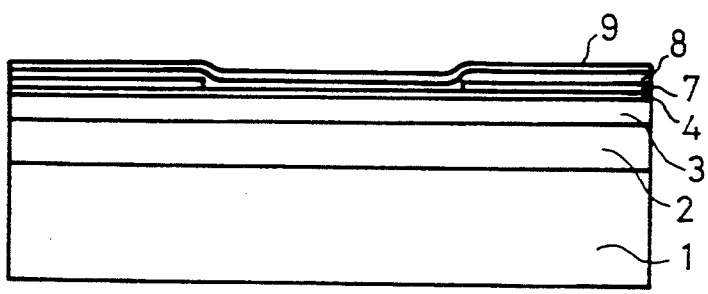
Figure 1D:
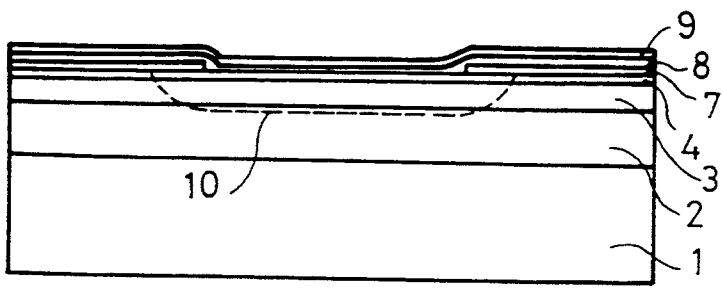
Figure 1E:
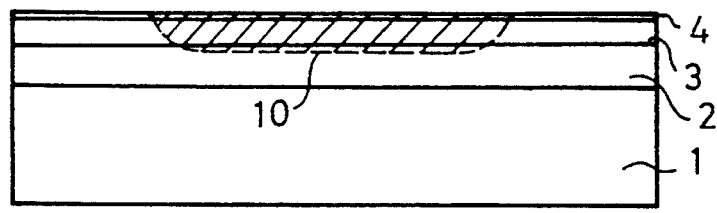
Figure 1F:
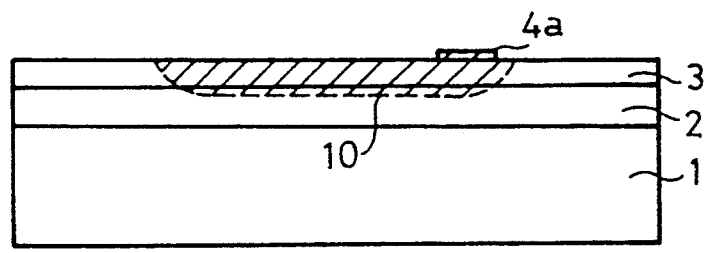
Figure 1G:
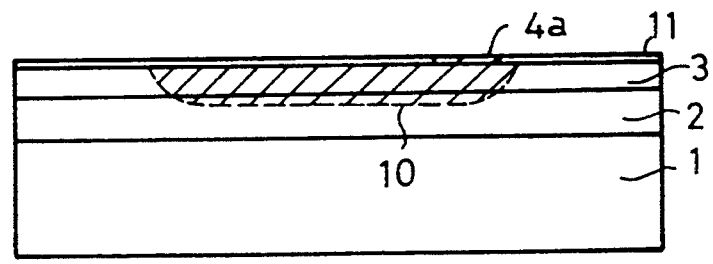
Figure 1H:
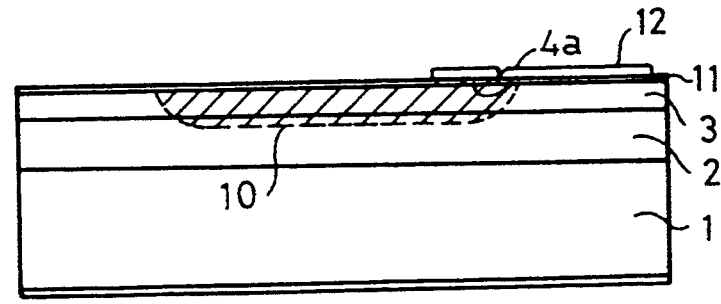
Figure 3F:
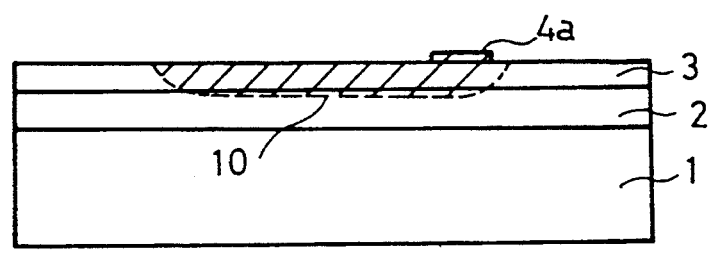
Figure 3G:
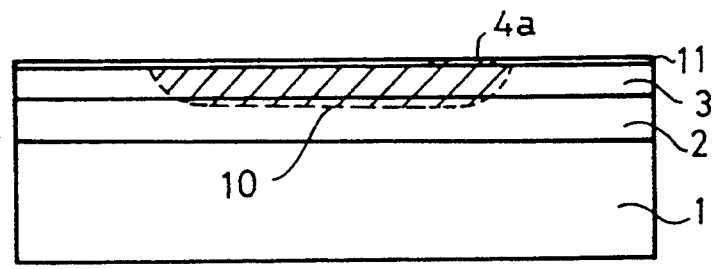
Figure 3H:
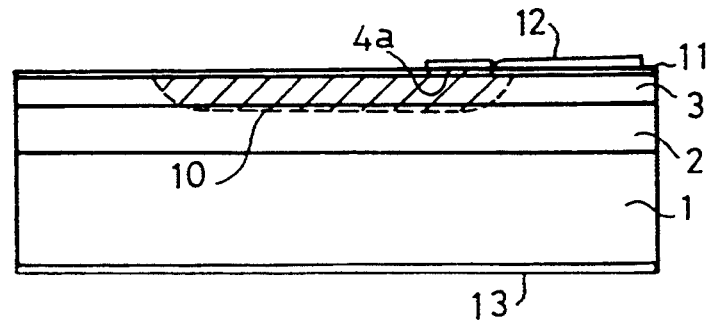

Steps shown in FIGS. 3(f)-3(h) correspond to tile steps of the prior art shown in FIGS. 1(f)-1(h), and, therefore, there is no need for explaining them.

As described in detail, according to this embodiment, the $n^-$-type InP capping layer 5 and the $n^-$-type InGaAs capping layer 6, which have coefficients of thermal expansion similar to that of the n⁻-type InGaAs contact layer 4, are disposed on the contact layer 4 which is the uppermost of the epitaxial layers of an InGaAs photodiode. The ZnO diffusion source layer 8 is disposed on the capping layers 5 and 6. Thus, defects which would result from the difference in thermal expansion coefficients the layers 4, 5 and 6 during the diffusion step are confined to the capping layer 6 which is in contact with the ZnO diffusion source layer 8, and in the capping layer 5. Since these capping layers 5 and 6 are later removed, the n⁻-type InGaAs contact layer 4 and, hence, an InGaAs photodiode are free of defects.

Because of the difference in lattice constants of the additional thin film layers 5 and 6 and the epitaxial layers of the InGaAs photodiode is selected to be within ±0.3 %, no defects are produced in the resulting photodiode because of differences in lattice constants. Further, because the difference in thermal expansion coefficients of the additional thin film layers 5 and 6 on one hand and the uppermost of the epitaxial layers of the InGaAs photodiode on the other hand is less than $3 \times 10^{-6}/°C$., no defects will be introduced into the device during the heat treatment.

In addition, since the additional thin film layer which is in contact with the ZnO diffusion source layer 8 comprises the n⁻-type InGaAs capping layer 6 which is free of phosphorus the is ready to react with Zn, diffusion of Zn is not interfered with.

Generation of defects in the InGaAs photodiode can be further reduced by employing a semiconductor superlattice layer or strained supperlattice layer having a thickness of 500 Å or less as part of the n⁻-type InGaAs and InP capping layers 6 and 5. In this case, it is not necessary that the lattice constant of the superlattice or strained superlattice layer and the lattice constant of the epitaxial layers of the photodiode be the same.

In the above-described embodiment, the additional thin film layers are described as having a constant thickness. The additional thin film layers may be etched to have a thickness gradually increasing from the center toward the periphery of the region corresponding to the diffusion region as defined by the mask. This results in a relatively large radius of curvature of the diffusion front so that the diffusion front curves gradually, which reduces edge breakdown.

Figure 4:
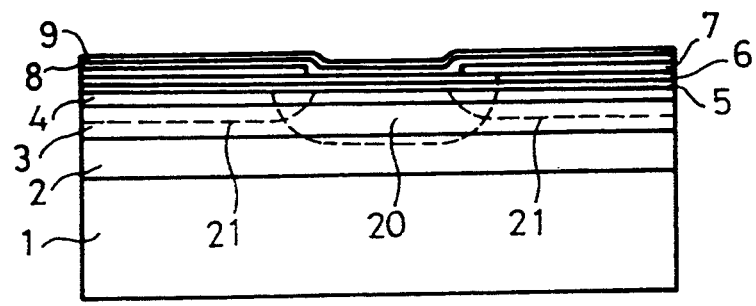
FIG. 4 is an enlarged cross-sectional view of a semiconductor device including an epitaxial layer in a manufacturing step characteristic of another embodiment of the present invention.

In the above-described embodiment, the additional thin film layers are described as having no solid phase diffusion source or impurity therein. However, they may contain a second solid phase diffusion material in addition to the ZnO diffusion source layer 8. For example, an n⁻-type InP capping layer containing S (or Si, Te, Se or the like) may be used as the n⁻-type InP capping layer 5. In the diffusion step, as shown in FIG. 4, S is diffused into that portion of the n⁻-type substrate around the p⁺-type region 20 to change that portion to an n⁺-type region 21 which can act as a channel stopper. The surface portion of the semiconductor substrate where the p-n junction intersects the surface is sometimes electrically unstable, and, in case that a depletion layer extraordinarily extends along the surface, dark current could be caused by, for example, crystallographic defects in the surface. The channel stopper can suppress a depletion layer from extending extraordinarily so as to prevent dark current. The same reference numerals as used in FIG. 2 denote similar components and, therefore, they need no further explanation.

As described, according to the present invention, no defects are introduced into epitaxial layers of a semiconductor device, so that leakage current which would otherwise be caused by defects is reduced.

What is claimed is:

1. A method of forming a diffusion region of a semiconductor device by solid phase diffusion comprising the steps of:
    epitaxially growing on a semiconductor substrate a plurality of semiconductor epitaxial layers sufficient for forming a semiconductor device;
    epitaxially growing at least one additional semiconductor layer on an uppermost one of the plurality of semiconductor epitaxial layers sufficient for forming a semiconductor device, said additional semiconductor layer not being essential for the operation of the semiconductor device and having a thermal expansion coefficient different from the thermal expansion coefficient of the uppermost semiconductor epitaxial layer by no more of the uppermost semiconductor epitaxial layer by no more than $3 \times 10^{-6}/°C$.;
    placing a first solid phase diffusion source material on the additional semiconductor layer;
    heat treating the structure including the plurality of semiconductor epitaxial layers, the additional semiconductor layer, and the first solid phase diffusion source material to diffuse the first solid phase diffusion source material through the additional semiconductor layer and into the plurality of semiconductor epitaxial layers to a desired depth; and
    removing at least part of the additional semiconductor layer and the first solid phase diffusion material.

2. The method according to claim 1 wherein the additional semiconductor layer comprises a material that can be selectively etched relative to the plurality of semiconductor epitaxial layers.

3. The method according to claim 1 wherein the total thickness of the additional semiconductor layer is from 100 Å to 5 μm.

4. The method according to claim 1 wherein the difference in lattice constants of the additional semiconductor layer and the uppermost semiconductor epitaxial layer is within a range of ±0.3%.

5. The method according to claim 4 wherein part of the additional semiconductor layer is a semiconductor superlattice layer having a thickness of no more than 500 Å.

6. The method according to claim 4 wherein part of the additional semiconductor layer is a semiconductor strained superlattice layer having a thickness of no more than 500 Å.

7. The method according to claim 1 including, after the heat treatment, selectively removing portions of the additional semiconductor layer in contact with the first solid phase diffusion source material.

8. The method according to claim 1 including varying the thickness of the additional semiconductor layer contacting the first solid phase diffusion source material to control the contour of a diffusion front formed in the heat treating step.

9. The method according to claim 1 wherein the additional semiconductor layer comprises a thin layer containing a second solid phase diffusion source material, and including diffusion the first and second solid phase diffusion source materials simultaneously into the plurality of semiconductor epitaxial layers.

10. A method of forming a diffusion region of a semiconductor device by solid phase diffusion comprising the steps of:

epitaxially growing on a semiconductor substrate a plurality of semiconductor epitaxial layers;

epitaxially growing at least one additional semiconductor layer on an uppermost one of the plurality of semiconductor epitaxial layers, said additional semiconductor layer having a thermal expansion coefficient different from the thermal expansion coefficient of the uppermost semiconductor epitaxial layer by no more than $3 \times 01^{-6}/°C$.;

placing a first solid phase diffusion source material on the additional semiconductor layer;

heat treating the structure including the plurality of semiconductor epitaxial layers, the additional semiconductor layer, and the first solid phase diffusion source material to diffuse the first solid phase diffusion source material through the additional semiconductor layer and into the plurality of semiconductor epitaxial layers to a desired depth; and removing the additional semiconductor layer and the first solid phase diffusion material.

11. The method according to claim 10 wherein the additional semiconductor layer comprises a material that can be selectively etched relative to the plurality of semiconductor epitaxial layers.

12. The method according to claim 10 wherein the total thickness of the additional semiconductor layer is from 100 Å to 5 μm.

13. The method according to claim 10 wherein the difference in lattice constants of the additional semiconductor layer and the uppermost semiconductor epitaxial layer is within a range of ±0.3%.

14. The method according to claim 13 wherein part of the additional semiconductor layer is a semiconductor superlattice layer having a thickness of no more than 500 Å.

15. The method according to claim 13 wherein part of the additional semiconductor layer is a semiconductor strained superlattice layer having a thickness of no more than 500 Å.

16. The method according to claim 10 including varying the thickness of the additional semiconductor layer contacting the first solid phase diffusion source material to control the contour of a diffusion front formed in the heat treating step.

17. The method according to claim 10 wherein the additional semiconductor layer comprises a thin layer containing a second solid phase diffusion source material, and including diffusing the first and second solid phase diffusion source materials simultaneously into the plurality of semiconductor epitaxial layers.

* * * * *

UNITED STATES PATENT AND TRADEMARK OFFICE
CERTIFICATE OF CORRECTION

PATENT NO. : 5,352,628
DATED : October 4, 1994
INVENTOR(S) : SHINJI FUNABA

It is certified that error appears in the above-indentified patent and that said Letters Patent is hereby corrected as shown below:

Column 6, lines 18-20, delete "of the uppermost semiconductor epitaxial layer by no more";

Column 6, line 63, change "diffusion" to --diffusing--;

Column 7, line 10, change "$3 \times 01^{-6}/°C$" to --$3 \times 10^{-6}/°C$--.

Signed and Sealed this

Thirty-first Day of January, 1995

Attest:

BRUCE LEHMAN

Attesting Officer

Commissioner of Patents and Trademarks